United States Patent
Zhou et al.

(10) Patent No.: US 6,787,749 B1
(45) Date of Patent: Sep. 7, 2004

(54) INTEGRATED SENSOR WITH FRAME MEMORY AND PROGRAMMABLE RESOLUTION FOR LIGHT ADAPTIVE IMAGING

(75) Inventors: Zhimin Zhou, Santa Clara, CA (US); Eric R. Fossum, La Crescenta, CA (US); Bedabrata Pain, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/512,145

(22) Filed: Feb. 23, 2000

Related U.S. Application Data (63) Continuation of application No. 09/323,556, filed on Jun. 1, 1999, now Pat. No. 6,057,539, and a continuation of application No. 08/867,835, filed on Jun. 3, 1997, now Pat. No. 5,909,026.
(60) Provisional application No. 60/030,646, filed on Nov. 12, 1996.

(51) Int. Cl.[7] ............................................. H01L 27/00
(52) U.S. Cl. .................................................. 250/208.1
(58) Field of Search ............... 250/208.1; 348/307–309, 348/302, 303, 317–319

(56) References Cited

U.S. PATENT DOCUMENTS

| | | | | |
|---|---|---|---|---|
| 5,262,871 A | * | 11/1993 | Wilder et al. | 348/307 |
| 5,402,171 A | | 3/1995 | Tagami et al. | 250/208.1 |
| 5,471,515 A | * | 11/1995 | Fossum et al. | 377/60 |
| 5,717,199 A | * | 2/1998 | Carbone et al. | 250/208.1 |
| 5,909,026 A | * | 6/1999 | Zhou et al. | 250/208.1 |
| 6,057,539 A | * | 5/2000 | Zhou et al. | 250/208.1 |

* cited by examiner

Primary Examiner—Thanh X. Luu
(74) Attorney, Agent, or Firm—Fish & Richardson P.C.

(57) ABSTRACT

An image sensor operable to vary the output spatial resolution according to a received light level while maintaining a desired signal-to-noise ratio. Signals from neighboring pixels in a pixel patch with an adjustable size are added to increase both the image brightness and signal-to-noise ratio. One embodiment comprises a sensor array for receiving input signals, a frame memory array for temporarily storing a full frame, and an array of self-calibration column integrators for uniform column-parallel signal summation. The column integrators are capable of substantially canceling fixed pattern noise.

16 Claims, 8 Drawing Sheets

INTEGRATED SENSOR WITH FRAME MEMORY AND PROGRAMMABLE RESOLUTION FOR LIGHT ADAPTIVE IMAGING

This application is a continuation (and claims the benefit of priority under 35 USC 120) of U.S. application Ser. No. 09/323,556, filed Jun. 1, 1999 now U.S. Pat. No. 6,057,539 and U.S. application Ser. No. 08/867,835, filed Jun. 3, 1997 now U.S. Pat. No. 5,909,026; and claims the benefit of priority under 35 USC 119(e)(1) of U.S. provisional application serial No. 60/030,646, filed Nov. 12, 1996. The disclosure of the prior application is considered part of (and is incorporated by reference in) the disclosure of this application.

ORIGIN OF THE INVENTION

The invention described herein was made in the performance of work under a NASA contract and is subject to the provisions of Public Law 96-517(35 U.S.C. 202) in which the Contractor has elected to retain title.

FIELD OF THE INVENTION

The present invention relates to semiconductor image sensors, and more specifically, to an imaging device with on-chip frame memory suitable for imaging applications under low lighting conditions.

BACKGROUND OF THE INVENTION

An active pixel sensor ("APS") is a light sensing device with sensing circuitry inside each pixel. Each active pixel includes a light sensing element and one or more active transistors within the pixel itself. The active transistors amplify and buffer the signals generated by the light sensing elements in the pixels. In comparison with the widely used charge coupled devices (CCDs), an APS device has a number of unique and beneficial features. These features include the ability to receive and process input signals with the active pixels without the charge transfer process inherent in CCDs. An APS device is also compatible with CMOS processes.

Elimination of the charge transfer allows APS devices to have a higher readout rate than those of CCDs and also to maintain their performance as the array size increases. Compatibility with CMOS processes allows many signal processing functions and operation controls to be integrated on an APS chip. Use of CMOS circuitry with APS devices also reduces cost of manufacturing and power consumption. Moreover, the active pixels of APS devices allow non-destructive readout and random access.

One configuration of APS sensors is disclosed in U.S. Pat. No. 5,471,515 by Fossum et al., the disclosure of which is incorporated herein by reference. Such an image sensor typically operates at a constant finite frame rate with a constant signal integration time. The frame rate and the integration time are often preset for normal operating conditions under which illumination is usually sufficient. The performance of such a conventional image sensor suffers when the illumination is below the typical level to which the image sensor is configured. Since the frame integration time is usually preset for a predetermined normal light condition, little signal may be collected under a low light condition with an illumination level below the predetermined normal light condition. Conversely, too much signal may also be collected when input light level is higher than the predetermined level. Thus, a clear image of a target can be difficult to obtain under different light conditions.

One conventional technique to circumvent this problem under low light conditions uses averaging the signals from a plurality of neighboring pixels in order to reduce the noise level. This averaging technique improves the signal-to-noise ratio of the image sensor. The averaging process, however, also reduces the image resolution. Suppose a patch of N×N pixels are averaged, the signal-to-noise ratio is then improved by a factor of $N^{1/2}$ while the resolution is reduced by a factor of N. One limitation of this averaging technique is that the signal level achieved from averaging essentially remains unchanged compared to the signal levels of the selected neighboring pixels. Additional signal amplification is thus needed to obtain a brighter image.

SUMMARY OF THE INVENTION

The present disclosure describes a new approach to the above-addressed problem in image sensors. Instead of averaging signals from selected neighboring pixels, signals of the neighboring pixels are preferably added together according to the present invention. In contrast to the prior-art method, a sensing device in accordance with the invention increases both the signal and the noise with different factors so that the overall signal-to-noise ratio improves by the signal processing. The total signal can be increased by a factor of $N^2$ for a square patch of N×N neighboring pixels. The total noise comparatively increases by a factor of $(N)^{1/2}$. This allows the signal-to-noise ratio to increase by a factor of $(N)^{1/2}$. One of the advantages of the present invention is significant enhancement in both the signal level and the signal-to-noise ratio.

An APS image sensor with an adaptive resolution based on the above new technique is disclosed herein. One embodiment comprises an APS array for receiving input signals, a column buffer array for generating photo-induced electrical signals indicative of the input signals, a frame memory array for storing signals from the APS array, a column integrator array for signal summation for rows selected by a row decoder, and an output integrator for signal summation for columns selected by a column selector.

One aspect of the APS image sensor of the present invention allows increasing the magnitude of the output image with a reduced spatial resolution under low illumination.

Another aspect of the APS image sensor of the present invention allows dynamically adjusting the image resolution and maintaining the output signal level above a preset level according to the conditions of a target object.

Still another aspect is a self-calibration feature of the column integrator array that allows substantial elimination of the column-wise fixed pattern noise in the signals both prior to and during the signal integration.

BRIEF DESCRIPTION OF THE DRAWINGS

These and other aspects and advantages of the present invention will become more apparent in light of the following detailed description, as illustrated in the accompanying drawings, in which.

DETAILED DESCRIPTION OF THE INVENTION

The description of the present invention will use a CMOS APS device as an example for implementation. However, it should be understood that the method and design can also be implemented in other active pixel sensors, and may be usable in other image-acquiring systems.

Figure 1A:
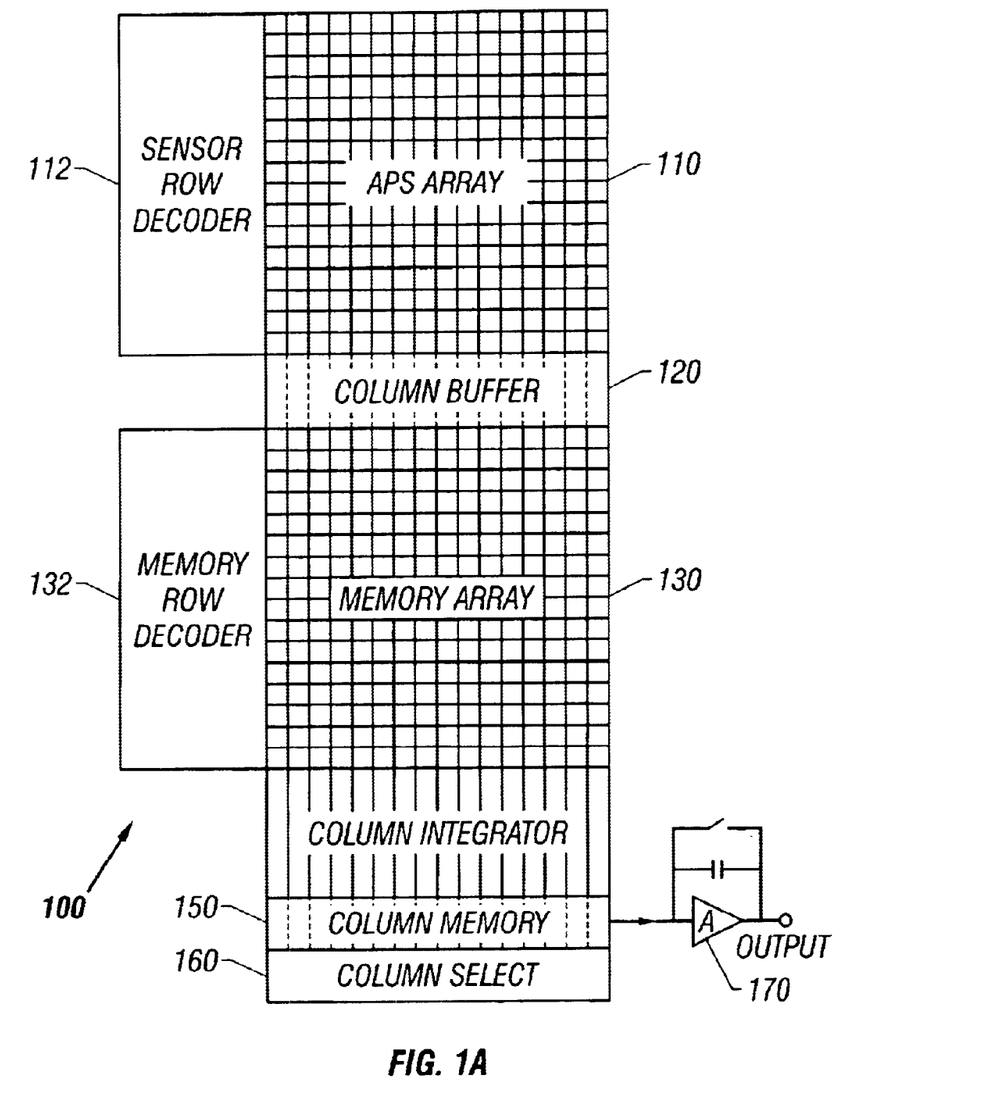
FIG. 1a is a schematic illustrating a preferred chip architecture of an APS image sensor in accordance with the present invention.

A chip construction 100 of the APS image sensor in accordance with the invention is shown in FIG. 1a. An active pixel array 110 with a plurality of active light-sensing pixels for receiving radiation from an target object is connected to a sensor row decoder 112 which operates to address rows of APS pixels. A column buffer array 120 has multiple buffer cells with each corresponding to a column of the APS array 110. Each column buffer cell receives signals from an addressed active pixel of the APS array 110 to generate a signal. That signal is induced only based on the received radiation in that active pixel.

A frame memory array 130 has memory cells with an one-to-one correspondence with the active pixels of the APS array 110. The radiation-induced signals of a full frame image captured by the APS array 110 are stored in an on-chip frame memory 130 prior to the signal integration. This on-chip frame memory 130 provides a convenient vehicle for light-adaptive imaging and can be further used in a time delay integration ("TDI"). A memory row decoder 132 is used to randomly access and select rows of memory cells in the frame memory 130.

A column integrator array 140 performs parallel signal summation for different rows of cells in the frame memory 130. The summed signals are stored in a column memory array 150 which usually includes a series of capacitors corresponding to the rows of the frame memory 130. A column select circuit 160 is used to randomly access and select cells in the column memory 150 (equivalently, columns of the frame memory 130) to be added with one another by an output integrator 170.

The APS chip 100 also includes a control circuit (not shown) for controlling the operation of the image sensor including operation of the clock generator circuits for synchronization, resolution adjustment, and the operation of the readout circuits.

The resolution of the output image can be determined by programmably changing the summation kernels in the frame memory 130 with the memory row decoder 132 and the column select 160. This operation can be controlled by a resolution control circuit (see FIG. 1b). The resolution control circuit monitors the magnitude of the received signal level from the APS array 110 so that the size of the summation kernel can be determined for a subsequent signal processing.

Figure 1B:
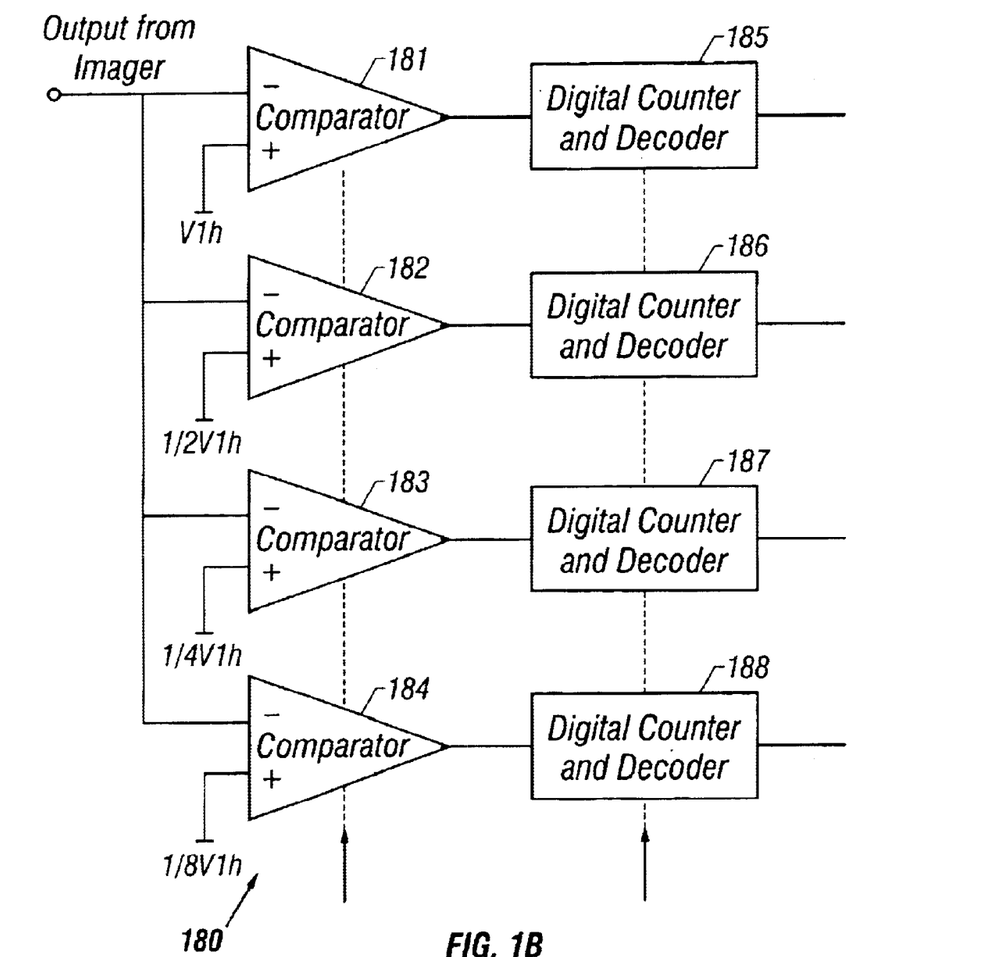
FIG. 1b is a block diagram showing an exemplar 4-bit command word generator for light adaptive resolution adjustment, which is a part of a resolution control circuit.

A threshold circuit with different levels of threshold values is used to determine the illumination condition and thereby adjust the kernel size. The smallest kernel size is one pixel for the highest resolution under good illumination. The resolution control circuit automatically increases the kernel size if the input signal decreases.

FIG. 1b shows a 4-bit command word generator 180 as one embodiment of the resolution control circuit. This circuit is used to adjust the resolution based on one frame of data by controlling the operation of the addressing circuit of the imaging array.

The command word generator 180 includes a plurality of comparators 181–184 connected in parallel so that all receive the imager output. Each of the comparators has a different threshold level. FIG. 1b shows four comparators 181, 182, 183, and 184 with threshold levels $V_{th}$, 0.5 $V_{th}$, 0.25 $V_{th}$, and 0.125 $V_{th}$, respectively. Each comparator is connected to an associated digital counter and decoder 185–188 to produce one of the bits of the 4-bit word. One way to determine a bit of a comparator is to assign "1" to a comparator if the signal is higher than the threshold value and "0" if the signal is lower than the threshold value. This allows the circuit to achieve $2^4$=16 different resolutions based on the 4-bit word.

In one mode for the command word generator 180, one pixel data sampled at the output of the sensor array is compared with four binary scaled threshold voltages. Referring back to FIG. 1a, the data may be sampled from the sensor array 110 or the frame memory array 130. The signal in each pixel of a captured frame is sampled and evaluated by the command word generator 180 in order determine the summation kernel size for a subsequent frame.

One extreme case is that the signals from more than half the number of the pixels are higher than $V_{th}$. Then the 4-bit word generated by the circuit 180 for each of these bright pixels is 1111. The control circuit may be programmed to indicate this case as a satisfactory illumination for the highest resolution depending on the requirements of an application. The resolution control circuit then configures the kernel size to be 1, i.e., no signal summation is performed and the resolution is the highest. Conversely, if the signals from more than half the number of the pixels are lower than the lowest threshold level (e.g., 0.125 $V_{th}$ in FIG. 1b), the 4-bit word is 0000 for each of these pixels. The control circuit may be programmed to indicate this case as a poor illumination. The resolution control circuit accordingly is controlled to set the kernel size to a preset maximum value and a predetermined lowest resolution will be used in the next frame readout. In adjusting the resolution, this implementation has one frame latency.

Figure 2A:
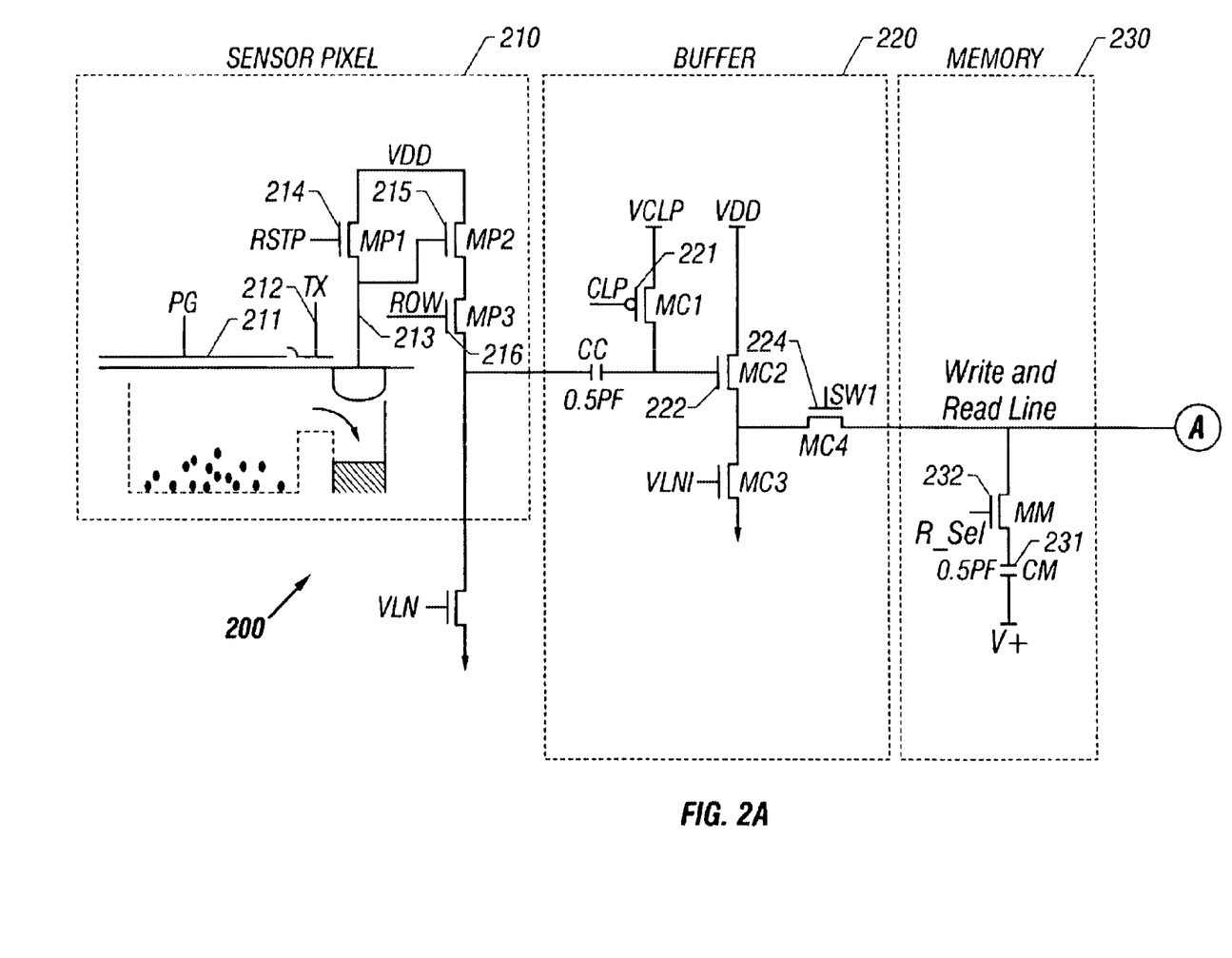
FIG. 2 shows a signal chain of the APS image sensor of the present invention including the active pixel layout, the column buffer circuit, the frame memory circuit, the column integrator circuit, and the output integrator circuit.
Figure 2B:
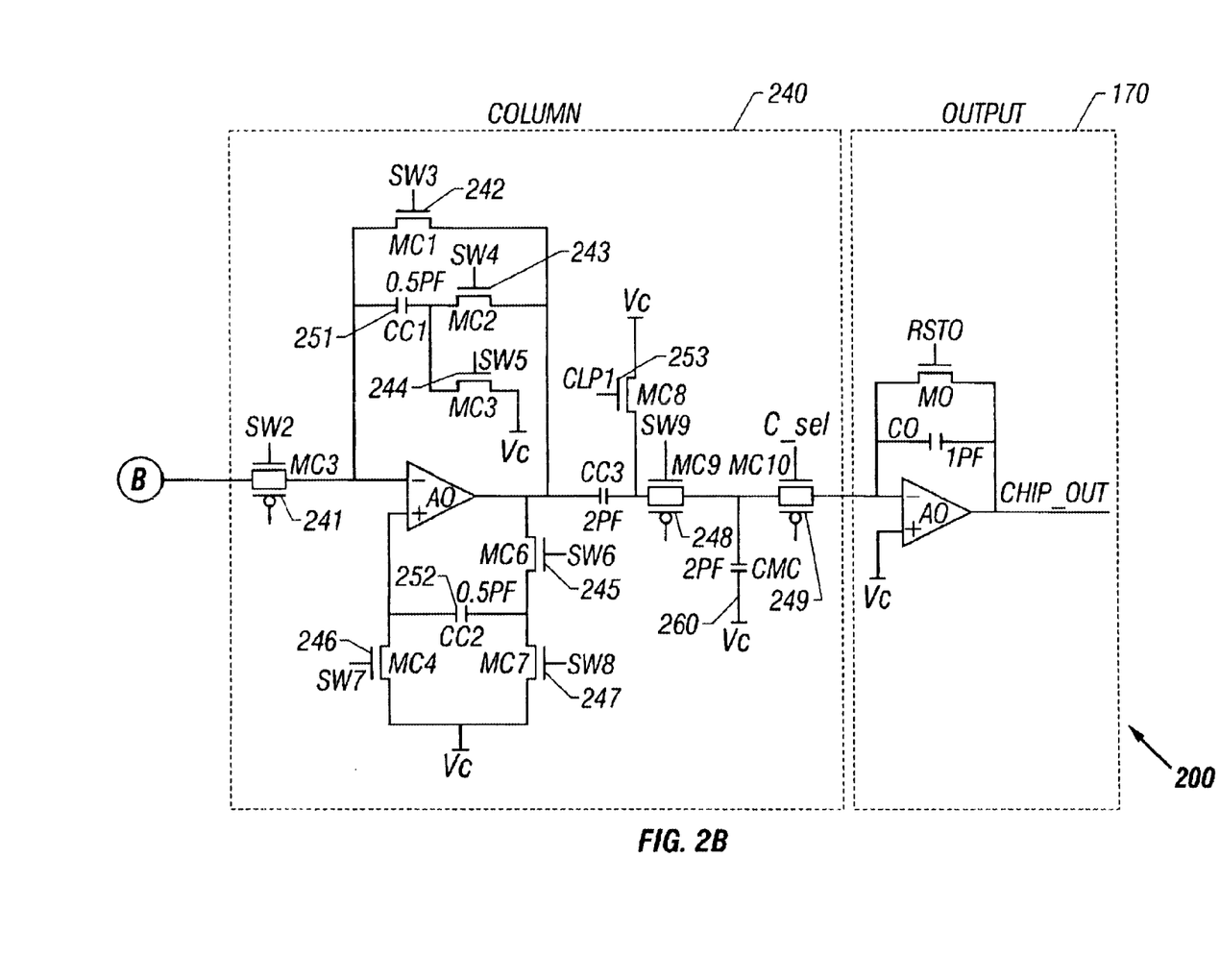

FIG. 2 shows a preferred signal chain 200 for the preferred chip architecture of FIG. 1a. It should be noted that the capacitance values in the FIG. 2 only represent typical values of an embodiment and should not be construed as limitations of the invention. An active pixel 210 includes a photogate 211, a transfer gate 212, an output floating diffusion 213, a reset transistor 214, a gate source follower 215, and a row selection transistor 216. Other design of the active pixel can also be used. An AC-coupled follower buffer 220 represents a column buffer cell in the column buffer array 120 shared by a column of active pixels in the APS array 110. The input of the buffer cell 220 is clamped to a finite voltage VCLP by a clock CLP as the active pixel 210 resets and is released as the active pixel 210 gives out a signal. Thus, the buffer cell 220 converts consecutively-sampled APS sensor reset level and signal level into an optically induced signal that is exported to a memory cell 230 of the frame memory 130. Many aspects of the APS pixel 210 and the buffer cell 220 are disclosed in the above-incorporated reference, U.S. Pat. No. 5,471,515.

The memory cell 230 includes a memory capacitor 231 and a switch transistor 232. Circuit 240 is a switched-capacitor integrator and represents one cell in the column integrator array 140 with input from cells of a row in the frame memory 130 (e.g., memory capacitor 231). A folded-cascade operational amplifier can be used as amplifier 240a; though other amplifiers may also be used. A column signal memory capacitor 260 (CMC), representing one cell in the column memory 150, is AC coupled to the integrator output port as a load when signals are integrated. An output integrator 170 includes a compensated two-stage opamp 172 with a large source-follower buffer to drive off-chip load at the video rate.

A typical CMOS APS sensor uses column-wise source follower buffers, e.g., source follower 215 in the active pixel 210 and the transistor 222 in the column buffer cell 220 shown in FIG. 2, to sample signals onto the memory capacitors. A column-wise spatial fixed pattern noise (FPN) may be introduced by such sampling due to the threshold mismatch in the source follower transistors. The column integrator 240 in each column is designed to achieve an accurate signal summation by compensating for not only the opamp input offset but also the signal mismatch error prestored in the column capacitor cell 231. An appropriate switching sequence in combination with a feedback capacitor 251 (CC1), an extra capacitor 252 (CC2), and a clamp circuit 221 at the input of source follower 222 is used to autonomously accomplish this self-calibration process in the column integrator 240 at the beginning of each frame.

Figure 3A:
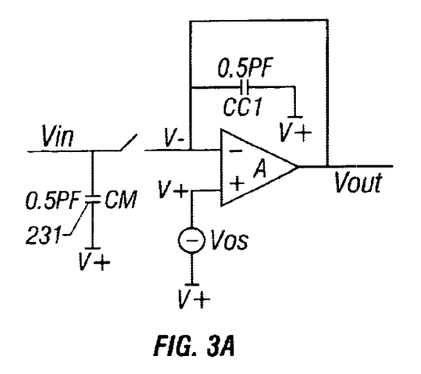
FIGS. 3a, 3b, 3c, and 3d show the equivalent circuit diagram of the column integrator during (a) calibration reset, (b) calibration sampling, (c)reset prior to integration, and (d) integration.
Figure 3B:
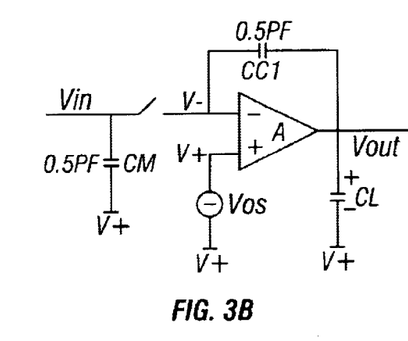

The self-calibration process is preferably carried out in the following four steps: reset, sampling, reset prior to integration, and signal integration. In the reset phase, the mismatch signal $\Delta V$ is sampled on to the memory capacitor cell 231 by switching on the transistor switch 224 (SW1). Transistor switches 242(SW3), 246 (SW7), and 247 (SW8) are turned at the same time, resulting in an effective circuit as shown in FIG. 3a. For simplicity of discussion, it is assumed that the common voltage $V_c=0$. At the end of the reset phase, the voltages at the input and output ports of the opamp 250 are $V_-=V_+=V_o=V_{os}$, wherein $V_{os}$ is the offset voltage of the opamp 250. In the sampling phase, the calibration proceeds to switch off transistor switches 242 (SW3), 247 (SW8), and 244 (SW5) and turning on the transistor switches 245 (SW6) and 241(SW2). FIG. 3b shows the equivalent circuit of the integrator 240 in the sampling phase. Conservation of charges in the above two phases dictates that:

$$C_{CM} \cdot \Delta V + C_{CC1} \cdot V_{os} = C_{CM} \cdot V_- + C_{CC1} \cdot (V_- - V_o). \quad (1)$$

Assuming $C_{CN}=C_{CC1}=C$ and substituting $V_-=V_+=V_{os}$, the calibration voltage at the output, $V_{o,c}$, can be expressed as $$V_{o,c}=V_{os}-\Delta V. \quad (2)$$

This voltage is sampled onto the effective load capacitance 302 (CL) at the sampling phase with a relative polarity shown in FIG. 3b.

Figure 3C:
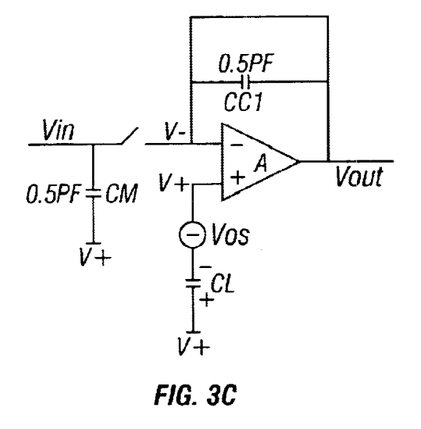

Next, a second reset is carried out as shown. By turning off transistor switches 245 (SW6) and 246 (SW7) and turning on transistor switch 247 (SW8), the capacitor 302 (CL) is connected to the non-inverting input of the opamp 250 with the flipped polarity. The voltages at the input ports of the opamp 250 become $V_+=V_{os}-V_{o,c}=\Delta V$. The amplifier is reset again by switching on transistor switch 242 (SW3), resulting in an initial output voltage $V_{o,i}=V_-=V_+=\Delta V$. FIG. 3c shows the equivalent circuit. At the same time, an input voltage $V_{in,1}$ is sampled onto the memory capacitor cell 231 along with the error voltage $\Delta V$.

Figure 3D:
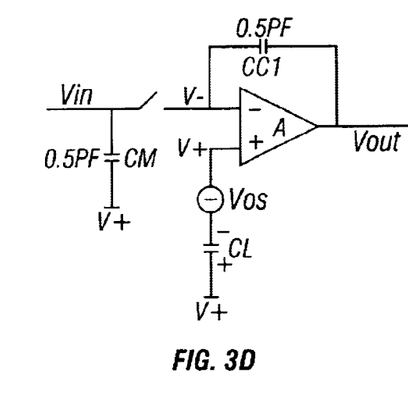
Figure 4A:
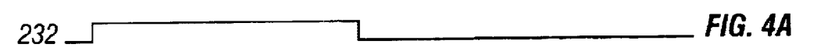
FIGS. 4a, 4b, 4c, 4d, 4e, 4f, 4g, 4h, 4i, and 4j show various electrical signals of an APS image sensor of the present invention in the time domain in a preferred operation mode for calibrating the fixed pattern noise.
Figure 4B:
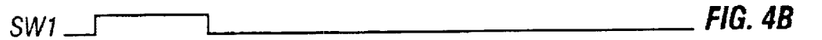
Figure 4C:
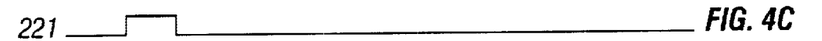
Figure 4D:
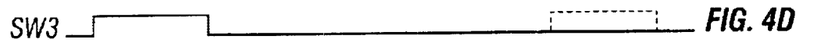
Figure 4E:
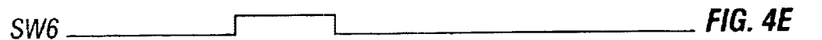
Figure 4F:
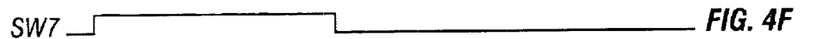
Figure 4G:
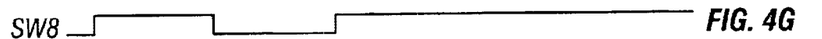
Figure 4H:
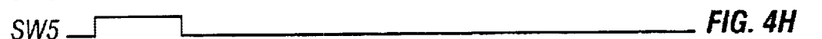
Figure 4I:
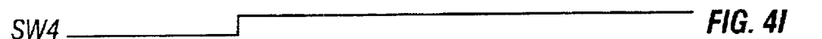
Figure 4J:
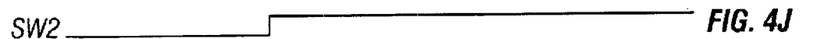
Figure 5A:
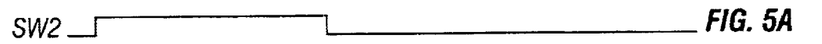
FIGS. 5a, 5b, 5c, 5d, 5e, 5f and 5g depict various electrical signals of the preferred APS image sensor in the time domain in an example of programmable resolution readout process.
Figure 5B:
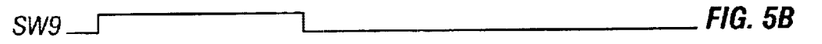
Figure 5C:
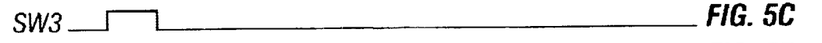
Figure 5D:
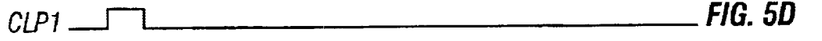
Figures 5E, 5F:
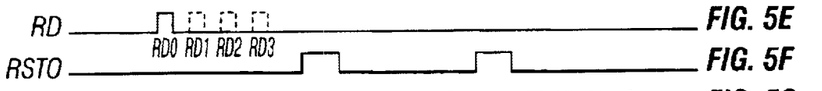
Figure 5G:
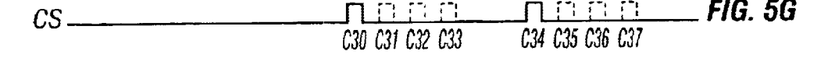

The equivalent circuit for the final integration phase is shown in FIG. 3d. The charge transfer can be expressed in the following equation:

$$C \cdot (V_{in,1}+\Delta V)=C \cdot V_- + C \cdot (V_- - V_{o,1}), \quad (3)$$

wherein $V_{o,1}$ is the output voltage of the integration:

$$V_{o,1}=2V_- - (V_{in,1}+\Delta V)=\Delta V - V_{in,1}. \quad (4)$$

The switching sequence for the self-calibration is illustrated in FIGS. 4a–4j.

The above self-calibration is for a first input signal $V_{in,1}$. For a subsequent integration step with an input signal $V_{in,2}$, the corresponding output voltage after an identical switching sequence can be expressed as $$V_{o,2}=2V_- - (V_{in,2}+\Delta V) - (V_- + V_{in,1} - \Delta V) = \Delta V - (V_{in,1}+V_{in,2}). \quad (5)$$

In general, the output voltage after nth step of integration is $$V_{o,n} = \Delta V - \sum_{i=1}^{n} V_{in,1}. \quad (6)$$

Clearly, the offset $V_{os}$ of the opamp is eliminated from the integration process. The residual mismatch error $\Delta V$ is further eliminated by an extra clamp circuit 253 (FIG. 2) as the column integrator 240 resets prior to the integration by the output integrator 170. Therefore, a linear summation of the photon-induced signal from the active pixels in the APS array 110 (e.g., 210) is achieved with the preferred column integrator 240.

Programmable resolution readout follows the self-calibration. With transistor switches 241(SW2) and 248 (SW9) on, the column integrator 240 is reset by turning on 242(SW3) momentarily. At the same time, the clamp circuit 221 is turned on by switching on the transistor switch 253(CLP1) to sample the clamped reset level of the integrator onto the column memory capacitor 260 at the output of the integrator 240. The switch 232 for selecting columns in each column is then turned on consecutively by the memory row decoder 132 for up to n rows if the kernel size is determined to be a square patch of n×n by the resolution control circuit. The signal from n rows are summed by the column integrator 140 and stored in the column memory array 150. Next, the transistor switch 248(SW9) is deactivated, and n consecutive columns are scanned after each reset of the output integrator 170 to add the signal from each kernel of n columns by an operation of the column select circuit 160. After all columns have been scanned, the next n rows are summed up in the same fashion. A full frame is read out after all the rows have been processed. Clock diagrams in FIGS. 5a–5g show the above-described sequence for a programmable resolution readout process.

For an APS array with m×m elements, the resolution of the output image with a square kernel of n×n pixels is given by (m/n)×(m/n). Hence, the resolution is programmable by varying the kernel size n based on the illumination condition. The signal-to-noise ratio of the output image is enhanced by n times while the spatial resolution thereof is reduced by n times. In addition, the output signal level is increased by a factor of $n^2$.

An embodiment of the APS image sensor in accordance with the present invention has 32×32 pixels. The sensor can be fabricated by a CMOS process using 1.2 $\mu$m n-well single poly and double metal with a linear capacitor option. The APS sensor pixel size is about 24 $\mu$m×24 $\mu$m. The frame memory cell pixel size may be approximately 24 $\mu$m×28 $\mu$m. The shape of each pixel cell in the frame memory may be slightly rectangular (i.e., the dimension along the column is longer) to achieve a memory capacitance of about 0.5 pf. The column integrators may be about 0.4 mm in a column pitch of about 24 $\mu$m. A double metal process, "metal II", is used in layout for column parallel routing because of the limited column width. Metal II is also used for light shield wherever possible in the frame memory array and column processing circuits. The total dye size of the chip may be approximately 2.8 mm×4.5 mm.

TABLE 1

Summary of Test Results

| | |
|---|---|
| Integrator linearity: | better than 8n bits for 1 V swing |
| Sensor saturation: 1 V | |
| Conversion gain: | 6 $\mu$V/e |
| Power consumptions | 1.5 mW @ 400 Frames/sec. |
| FPN with calibration: | 15 mV |
| FPN without calibration: | 40 mV |
| Memory leakage: | not observable in 1 second |

Eighteen out of twenty-four fabricated parts that were tested worked properly without any defective pixels. Table 1 summarizes the test results. The linearity of both the column and the output integrators was better than about 8 bit in 1 V swing. The sensor had about 1 V signal saturation which was mainly limited by the dynamic range of the sensor pixel source-follower. The frame memory array had no observable leakage up to about 1 second. Total power consumption of the chip at a frame rate of 400 Hz was measured to be about 1.58 mW.

Figure 6:
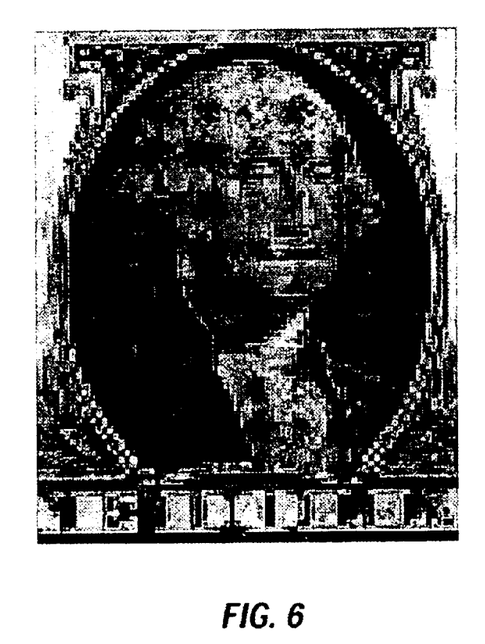
FIG. 6 shows an image with full resolution taken with a tested image sensor in accordance with the present invention.

FIG. 6 shows an image with full resolution taken at 100 kPixels/sec with the tested sensor. With an error calibration activated, the column-wise fixed pattern noise (FPN) at full resolution was about 15 mV. This FPN did not increase as the signals from neighboring pixels were integrated. The residue FPN was found to be caused by the non-uniform charge injection. With the error calibration deactivated, the FPN was about 40 mV at full resolution.

Figure 7A:
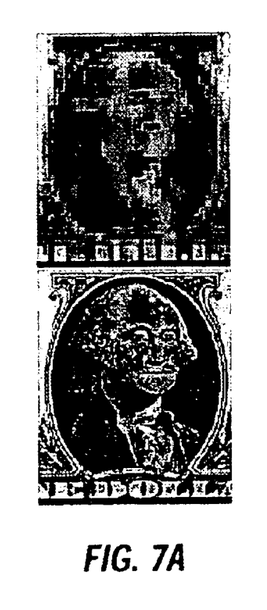
FIGS. 7a–7b and 8a–8b show signal enhancement by changing the kernel size in a tested image sensor in accordance with the present invention.
Figure 7B:
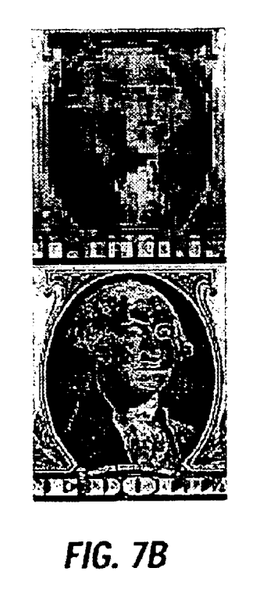
Figure 8A:
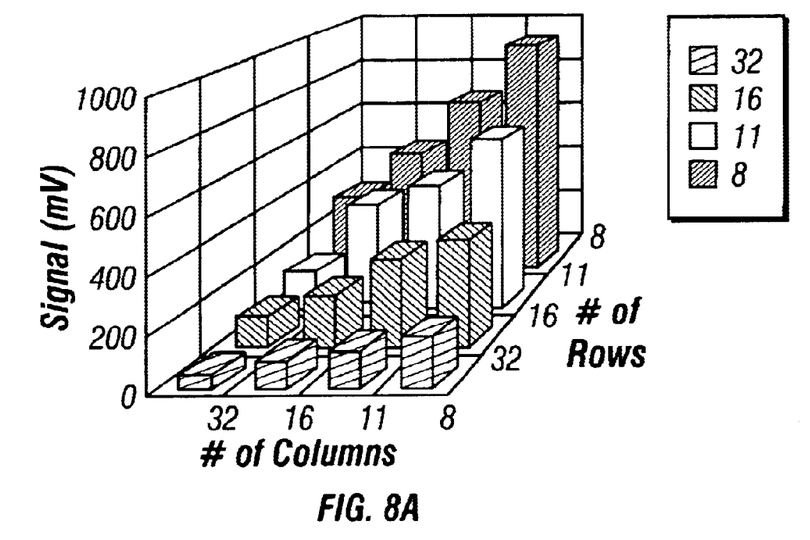
Figure 8B:
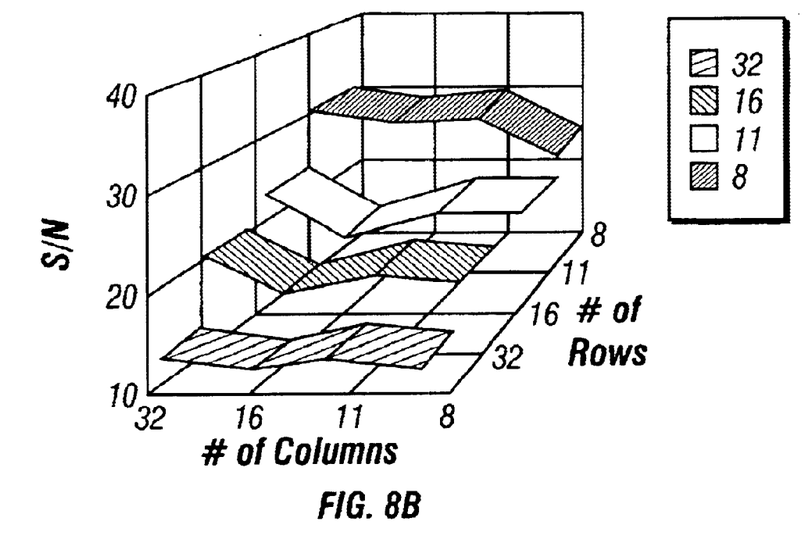

FIGS. 7a and 7b demonstrate the signal enhancement when integration kernel changes from 1×1 pixels to 2×2 pixels with the same frame integration time. Much better image quality is achieved with the FPN calibration (FIG. 7a) than without the FPN calibration(FIG. 7b). At the lower resolution, a clear picture is achieved for an image hardly recognizable at the full resolution. FIGS. 8a and 8b show the detailed measurement, at a uniform illumination, of the signal (FIG. 8a) and the signal-to-noise ratio enhancement (FIG. 8b) as the summation kernel changes from 1×1 pixels to 4×4 pixels. A 60-mV signal from the single pixels is summed up to about 940 mV. The signal-to-noise ratio is enhanced following the square root rule as signals from different rows are summed.

One unique aspect of the present invention is its light adaptive imaging. In particular, the preferred APS image sensor can autonomously and dynamically adjust the spatial resolution of the output image therefrom to maintain a desired magnitude for an output signal in each output pixel according to the conditions of a targeted object. Specifically, as the illumination, i.e., incoming radiation from the object, becomes insufficient (i.e., below a threshold level) in maintaining a desired signal-to-noise ratio for a selected output image resolution with a given kernel size, the preferred APS image sensor will attempt to maintain the desired signal-to-noise ratio and enhance the output signal level by reducing the resolution of the output image with a properly increased kernel size. Conversely, if the illumination of the targeted object increases above the threshold level for the selected output resolution, the preferred APS image sensor will attempt to increase the output resolution while maintaining the reduced signal-to-noise ratio at the desired level by reducing the kernel size.

Furthermore, this light adaptive imaging capability of the present invention allows for optimized imaging of a targeted object that moves with respect to the image sensor. One example of such an application is the imaging of a fixed target with an image sensor on aircraft or spacecraft.

Since the aperture of the image sensor is usually fixed and the distance between the targeted object and the image sensor changes, both the field of view of the image sensor and the view angle of the object change with the target distance. If the aircraft or spacecraft is far away from the targeted object, the field of view and the view angle are small. This means the received amount of light emitted by the object is small and the needed resolution for truthfully capturing the target image becomes low. The preferred APS image sensor can operate with a reduced output resolution by increasing the kernel size. This enhances the image brightness and the signal-to-noise ratio without sacrificing any image details of the targeted object. As the aircraft or spacecraft approaches the targeted object, the field of view increases and thereby the captured light from the object increases accordingly. Meanwhile, the view angle of the object increases and it is desirable to increase the output resolution of the image sensor for more detailed feature information of the object that is now available since the object is closer. Therefore, the preferred APS image sensor can reduce the kernel size to increase the output resolution while maintaining a sufficient brightness of the image with a signal-to-noise ratio above the threshold level.

The inventors further recognized that the sensor of the present invention can be used for time delay integration ("TDI"). A sensor in accordance with the invention can effectively function as an TDI sensor by feeding the column integrated signal back to the memory array so that the signal can be summed with the data from a subsequent frame, with a time delay. This TDI signal processing may be used in a situation where the image sensor and a target object have a relative motion with respect to each other so that captured images in two sequential frames of the target object are shifted on the image sensor. For example, a feature of the object that is captured on the kth row in one frame may be captured on the (k+2)th row in a subsequent frame due to the relative motion. Accordingly, the signal in the kth row of the first frame will be added with the signal in the (k+2)th row of the second frame in summing the signals of the two frames in a TDI process.

Although the present invention has been described in detail with reference to one embodiment, one ordinarily skilled in the art to which this invention pertains will appreciate that various modifications and enhancements may be made without departing from the scope and spirit of the present invention.

For example, any other image sensor, other than an APS array, may be used in practicing the present invention. In general, any voltage or charge mode readout sensor array may be used with the same scheme and circuits having the same functionality. Some examples of such image sensors include an CCD array sensor, a photodiode array sensor, a charge injection image sensor, and a hybrid focal plane array sensor. Also, the scheme disclosed herein can be used in all situations wherein signal integration is performed.

Different type of amplifiers and integrators rather than those disclosed above can be adopted in practicing the present invention.

Although the preferred sensor can be advantageous in light adaptive imaging applications, the sensor may also be used as a regular analog readout sensor when operating in a single resolution mode.

In addition, any shape of pixel patches rather than a square shape may be used for a summation kernel, including a rectangular patch of pixels with m by n pixels (m≠n).

These and other variations are intended to be encompassed by the following claims.

What is claimed is:

1. An adaptive programmable light imaging device, comprising:
   an array of active pixel sensor pixels, each pixel producing a signal based only on the received radiation within the pixel;
   a plurality of programmable summation kernels, each summation kernel programmable to selectively sum together a number of said pixels from said active pixel sensor; and
   a resolution control circuit, producing an output signal which controls a size of said summation kernels between a minimum value kernel size and a maximum value kernel size by monitoring a received signal level from individual pixels, statistically determining numbers of pixels which are in specified states, and automatically changing the size of the summation kernels based on statistically determining.

2. A device as in claim 1, wherein said resolution control circuit is based on illumination condition, and decreases the kernel size for better illumination condition and increases the kernel size for poorer illumination condition.

3. A device as in claim 2, wherein said minimum kernel size is one pixel.

4. A device as in claim 2, wherein said illumination condition is judged by a magnitude of said signal from said active pixel sensors.

5. A device as in claim 2, wherein said resolution control circuit includes a digital circuit.

6. A device as in claim 5, wherein said digital circuit includes a plurality of comparators, each having a different threshold, and wherein said signal from said active pixel sensors is input in parallel to each of said comparators.

7. A device as in claim 6, wherein outputs of said comparators are connected to output respective signals.

8. A device as in claim 2, wherein said active pixel sensor includes a photoreceptor and a buffer transistor and a selection transistor.

9. A device as in claim 8, further comprising self-calibrating the circuit prior to detecting an illumination condition.

10. An adaptive programmable light imaging device, comprising:
    an array of active pixel sensor pixels, each pixel producing a signal based only on the received radiation within the pixel;
    a plurality of programmable summation kernels, each summation kernel programmable to selectively sum together a number of said pixels from said active pixel sensor; and
    a resolution control circuit, producing an output signal which controls a size of said summation kernels between a minimum value kernel size and a maximum value kernel size by monitoring a received signal level from individual pixels, statistically determining numbers of pixels which are in specified states, and automatically changing the size of the summation kernels based on statistically determining further comprising a counter which counts a number of pixels which are in specified illumination states and sets said summation kernel size based on said count.

11. A device as in claim 10, wherein said counter detects whether at least half of the image has sufficiently bright pixels, and if so, configures the kernel size to be one.

12. A device as in claim 10, wherein said counter determines if at least half of the number of pixels are dimmer than a specified value, and if so sets the kernel size to a preset maximum value.

13. An adaptive programmable light imaging device, comprising:
    an array of active pixel sensor pixels, each pixel having an in-pixel buffer transistor, and in-pixel selection transistor, and a photoreceptor producing a signal based only on the received radiation within the pixel;
    a double sampling circuit, operating to eliminate at least one amplifier offset from said signal;
    a plurality of programmable summation kernels, each summation kernel programmable to selectively sum together a number of said pixels from said active pixel sensor; and
    a resolution control circuit, including an illumination condition detecting part connected to said active pixel sensor pixels and determining the illumination condition therefrom, and producing an output signal which automatically controls a size of said summation kernels between a minimum value kernel size for a maximum illumination condition, and a maximum value kernel size based on a minimum illumination condition, wherein said illumination condition detecting part comprises a counter which counts numbers of pixels which are in specified illumination states and sets said summation kernel size based on said count.

14. A device as in claim 13, wherein said counter detects whether at least half of the image has sufficiently bright pixels, and if so, configures the kernel size to be on.

15. A device as in claim 13, wherein said counter determines if at least half of the number of pixels are dimmer than a specified value, and if so sets the kernel size to a preset maximum value.

16. A device as in claim 13, further comprising a frame memory, for storing an entire frame as a stored frame, and wherein said resolution control circuit is based on illumination condition in said stored frame, and decreases the kernel size in a subsequent frame for better illumination condition and increases the kernel size in said subsequent frame for poorer illumination condition.

* * * * *